US012573441B2

(12) United States Patent
Hamo et al.

(10) Patent No.: US 12,573,441 B2
(45) Date of Patent: Mar. 10, 2026

(54) DATA STORAGE DEVICE AND METHOD FOR OPTIMIZED REFRESH

(71) Applicant: Sandisk Technologies, Inc., Milpitas, CA (US)

(72) Inventors: Eyal Hamo, Naharia (IL); Sagi Taragan, Ramat Ishay (IL); Yigal Eli, Tel Aviv (IL)

(73) Assignee: Sandisk Technologies, Inc., Milpitas, CA (US)

( * ) Notice: Subject to any disclaimer, the term of this patent is extended or adjusted under 35 U.S.C. 154(b) by 222 days.

(21) Appl. No.: 18/225,766

(22) Filed: Jul. 25, 2023

(65) Prior Publication Data

US 2024/0386934 A1     Nov. 21, 2024

Related U.S. Application Data

(60) Provisional application No. 63/467,131, filed on May 17, 2023.

(51) Int. Cl.
*G11C 11/406*     (2006.01)
*G11C 11/4096*     (2006.01)

(52) U.S. Cl.
CPC .. *G11C 11/40615* (2013.01); *G11C 11/40622* (2013.01); *G11C 11/4096* (2013.01)

(58) Field of Classification Search
CPC ........................... G11C 11/4061; G11C 11/406
USPC ........................................................ 365/222
See application file for complete search history.

(56) References Cited

U.S. PATENT DOCUMENTS

| | | | | |
|---|---|---|---|---|
| 7,814,382 | B2 * | 10/2010 | Sutardja | ................. G11C 29/26 |
| | | | | 365/201 |
| 8,289,797 | B2 | 10/2012 | Jain et al. | |
| 8,341,497 | B2 | 12/2012 | Fukutomi et al. | |
| 8,559,258 | B1 * | 10/2013 | Stephens, Jr. | ....... G11C 11/4094 |
| | | | | 365/222 |
| 8,601,204 | B2 | 12/2013 | Rajan et al. | |
| 8,705,307 | B2 | 4/2014 | Henderson et al. | |
| 10,665,273 | B2 | 5/2020 | Kim et al. | |
| 10,802,911 | B2 | 10/2020 | Shulkin et al. | |
| 10,996,863 | B1 | 5/2021 | Kuzmin et al. | |
| 11,188,268 | B1 | 11/2021 | Sharon et al. | |
| 2011/0093726 | A1 | 4/2011 | Worthington et al. | |
| 2014/0059287 | A1 * | 2/2014 | Bains | ................ G11C 11/40622 |
| | | | | 711/106 |
| 2014/0085999 | A1 * | 3/2014 | Kang | .................... G11C 11/408 |
| | | | | 365/222 |

(Continued)

FOREIGN PATENT DOCUMENTS

| | | |
|---|---|---|
| CN | 114492269 A | 5/2022 |
| WO | WO 2022/072993 A1 | 4/2022 |

OTHER PUBLICATIONS

International Search Report and Written Opinion mailed May 17, 2024 from PCT/US2024/011245.

(Continued)

*Primary Examiner* — Muna A Techane
(74) *Attorney, Agent, or Firm* — Crowell & Moring LLP

(57) ABSTRACT
A data storage device and method for optimized refresh are provided. In one embodiment, a data storage device is provided comprising a memory and a controller. The controller is configured to: receive, from a host, an identification of a location in the memory; calculate an estimated time to refresh the location in the memory; send the estimated time to the host; and refresh the location in the memory. Other embodiments are provided, and each of the embodiments can be used alone or in combination.

18 Claims, 6 Drawing Sheets

(56) References Cited

U.S. PATENT DOCUMENTS

| | | | | |
|---|---|---|---|---|
| 2017/0110178 A1* | 4/2017 | Bains | .................. | G11C 8/12 |
| 2018/0024920 A1 | 1/2018 | Thomas et al. | | |
| 2018/0025772 A1 | 1/2018 | Lee et al. | | |
| 2018/0374546 A1* | 12/2018 | Shi | .................. | G11C 29/52 |
| 2020/0042207 A1 | 2/2020 | Kwak et al. | | |
| 2020/0089410 A1 | 3/2020 | Park et al. | | |
| 2021/0182166 A1 | 6/2021 | Hahn et al. | | |
| 2022/0189535 A1 | 6/2022 | Kim | | |

OTHER PUBLICATIONS

"HMR: Add support for the new command type"; beanhuo/ufs-utils-Micron; Dec. 9, 2019; 3 pages.
"Data scrubbing"; Wikipedia article; Wikipedia—The Free Encyclopedia; downloaded from the Internet on Jul. 24, 2023 at https://en.wikipedia.org/wiki/Data_scrubbing; April 10. 2022; 5 pages.
"Integrated UFS4.0 Specification"; JEDEC Committee Letter Ballot, Item JC64.1 #139.55; JEDEC; Feb. 9, 2022; 495 pages.
"nvme-get-lba-status—Get LBA Status from NVMe device"; NVME program user space utility for NVME Manual, version 2.5-1; downloaded from the Internet on Jul. 24, 2023 at nvme-get-lba-status(1) —Arch manual pages (archlinux.org); ARCH Linux; Jul. 2, 2023; 3 pages.
"nvme-get-lba-status—Get LBA Status from NVMe device"; NVME program user space utility; 22.04 LTS; downloaded from the Internet on Jul. 24, 2023 at Ubuntu Manpage: nvme-get-lba-status—Get LBA Status from NVMe device; Ubuntu; Canonical Ltd.; 2019; 4 pages.

* cited by examiner

DATA STORAGE DEVICE AND METHOD FOR OPTIMIZED REFRESH

CROSS-REFERENCE TO RELATED APPLICATION

This application claims priority to U.S. provisional patent application No. 63/467,131, filed May 17, 2023, which is hereby incorporated by reference.

BACKGROUND

A host can store and read data from a memory in a data storage device. Some applications, such as automotive applications, may require the data storage device operate at a certain level of reliability. However, the reliability of a data storage device can decrease due to various errors that can occur in the stored data. Such errors can also increase the latency in reading the data, as time is spent by the data storage device during the read operation to attempt to correct the errors in the data. To increase reliability and reduce latency, the data storage device can automatically perform internal background operations to attempt to correct errors in the stored data before a host requests the data be read. Also, the Universal Flash Storage (UFS) 3.1 specification defines a "host manual refresh (HMR)" command. In response to receiving the HMR command from the host, the data storage device can perform a background refresh operation on the entirety of its memory or on certain memory blocks selected by the data storage device.

DETAILED DESCRIPTION

Figures 1A, 1B, 1C:
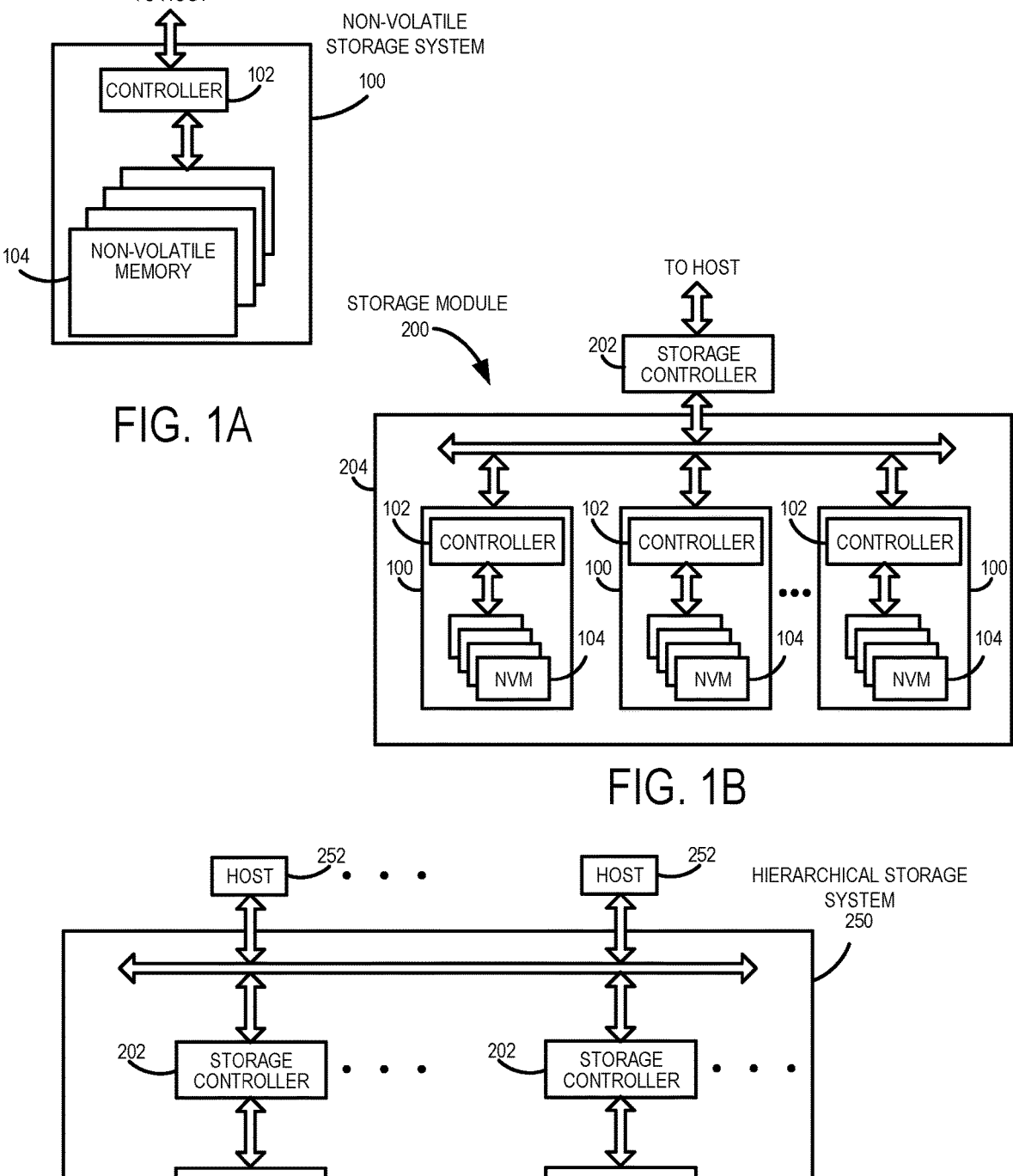
FIG. 1A is a block diagram of a data storage device of an embodiment.
FIG. 1B is a block diagram illustrating a storage module of an embodiment.
FIG. 1C is a block diagram illustrating a hierarchical storage system of an embodiment.

The following embodiments generally relate to a data storage device and method for optimized refresh. In one embodiment, a data storage device is provided comprising a memory and a controller. The controller is configured to: receive, from a host, an identification of a location in the memory; calculate an estimated time to refresh the location in the memory; send the estimated time to the host; and refresh the location in the memory.

In some embodiments, the controller is further configured to: receive, from the host, a request to refresh the location in the memory; wherein the location in the memory is refreshed in response to the request from the host to refresh the location in the memory.

In some embodiments, the controller is further configured to: determine a reliability level of the location in the memory; wherein the estimated time to refresh the location in the memory is calculated in response to the reliability level being below a threshold.

In some embodiments, the controller is further configured to: receive, from the host, a condition; wherein the estimated time to refresh the location in the memory is calculated in response to the condition being satisfied.

In some embodiments, the condition comprises a program-erase count threshold of the location in the memory.

In some embodiments, the location in the memory is identified by a logical block address.

In some embodiments, the location in the memory is identified by a logical unit number.

In some embodiments, the controller is further configured to: prioritize the location in the memory for a read patrol operation.

In some embodiments, the controller is further configured to: perform a read patrol operation on the location in the memory before performing the read patrol operation on other locations in the memory.

In some embodiments, the controller is further configured to: increase a number of pages in the location in the memory available for a read patrol operation.

In some embodiments, the controller is further configured to: update a read threshold for the location in the memory during a read patrol operation on the location in the memory.

In some embodiments, the location in the memory is a subset of the memory.

In some embodiments, the memory comprises a three-dimensional memory array.

In another embodiment, a method is provided that is performed in a host in communication with a data storage device comprising a memory. The method comprises: calculating a latency in reading an area in the memory of the data storage device; and in response to the latency being above a threshold, sending a command to the data storage device to refresh the area in the memory, wherein the area in the memory is a subset of all areas in the memory.

In some embodiments, the method further comprises calculating a latency in reading the area in the memory after the area in the memory has been refreshed.

In some embodiments, the method further comprises sending a condition to the data storage device, wherein the data storage device is configured to refresh the area in the memory in response to the condition being satisfied.

In some embodiments, the condition comprises a program-erase count threshold of the area in the memory.

In some embodiments, the area in the memory is identified by a logical block address.

In some embodiments, the area in the memory is identified by a logical unit number.

In another embodiment, a data storage device comprising a memory and means for refreshing only a portion of the memory in response to a request from a host.

Other embodiments are possible, and each of the embodiments can be used alone or together in combination. Accordingly, various embodiments will now be described with reference to the attached drawings.

EMBODIMENTS

The following embodiments relate to a data storage device (DSD). As used herein, a "data storage device" refers to a device that stores data. Examples of DSDs include, but are not limited to, NAND flash memory devices (e.g., according to the Universal File System (UFS) specification), hard disk drives (HDDs), solid state drives (SSDs), tape drives, hybrid drives, etc. Details of example DSDs are provided below.

Data storage devices suitable for use in implementing aspects of these embodiments are shown in FIGS. 1A-1C. FIG. 1A is a block diagram illustrating a data storage device 100 according to an embodiment of the subject matter described herein. Referring to FIG. 1A, data storage device 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC) (e.g., dual-level cells, triple-level cells (TLC), quad-level cells (QLC), etc.) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, the data storage device 100 may be a card-based system, such as a secure digital (SD) or a micro secure digital (micro-SD) card. In an alternate embodiment, the data storage device 100 may be part of an embedded data storage device.

Although, in the example illustrated in FIG. 1A, the data storage device 100 (sometimes referred to herein as a storage module) includes a single channel between controller 102 and non-volatile memory die 104, the subject matter described herein is not limited to having a single memory channel. For example, in some architectures (such as the ones shown in FIGS. 1B and 1C), two, four, eight or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile data storage devices 100. As such, storage module 200 may include a storage controller 202 that interfaces with a host and with data storage device 204, which includes a plurality of data storage devices 100. The interface between storage controller 202 and data storage devices 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective data storage device 204. Host systems 252 may access memories within the storage system 250 via a bus interface. In one embodiment, the bus interface may be a Non-Volatile Memory Express (NVMe) or Fibre Channel over Ethernet (FCOE) interface. In one embodiment, the system illustrated in FIG. 1C may be a rack mountable mass storage system that is accessible by multiple host computers, such as would be found in a data center or other location where mass storage is needed.

Figure 2A:
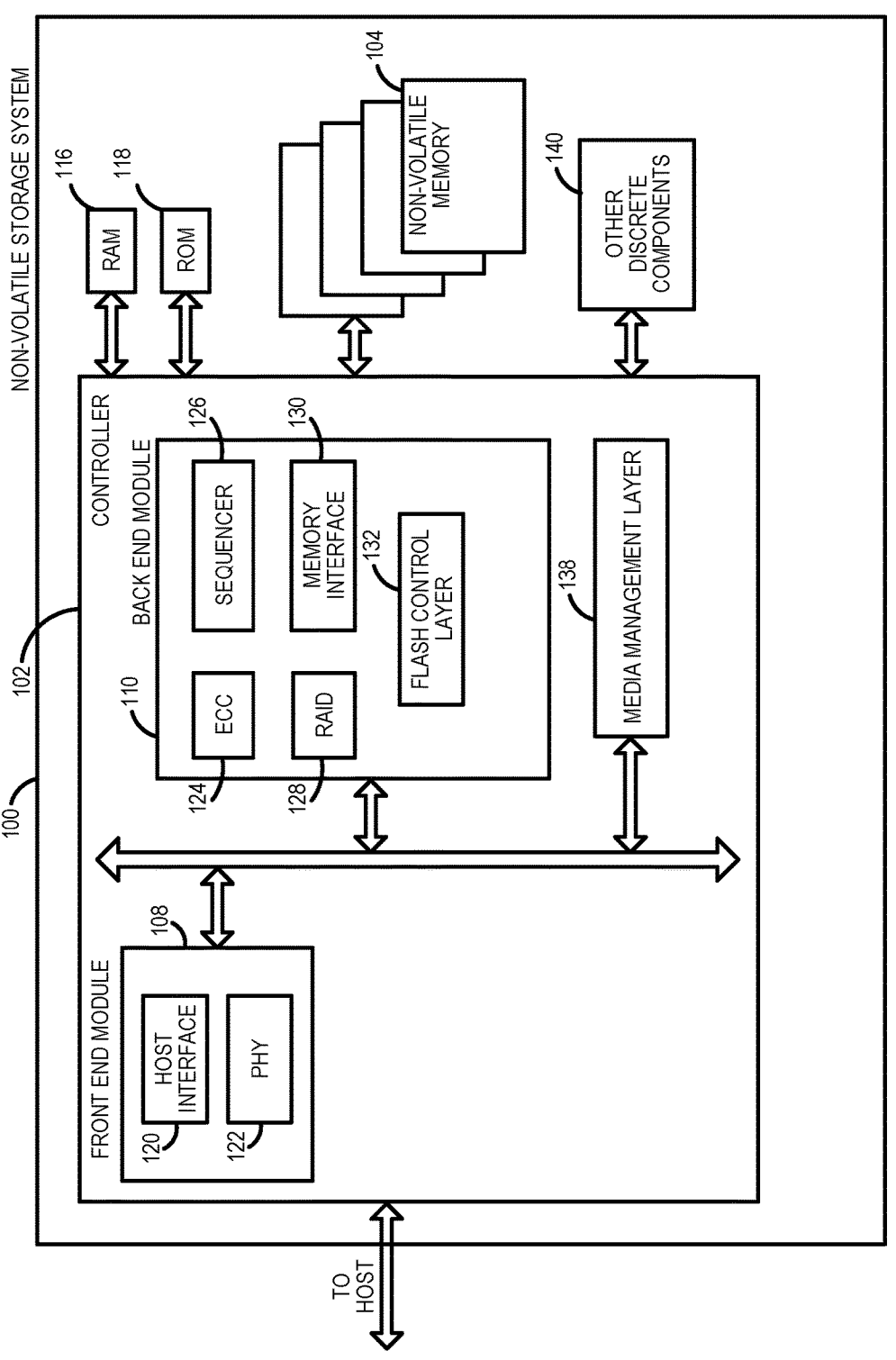
FIG. 2A is a block diagram illustrating components of the controller of the data storage device illustrated in FIG. 1A according to an embodiment.

FIG. 2A is a block diagram illustrating components of controller 102 in more detail. Controller 102 includes a front-end module 108 that interfaces with a host, a back-end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro) processor or processing circuitry that usually performs a particular function of related functions, or a selfcontained hardware or software component that interfaces with a larger system, for example. Also, "means" for performing a function can be implemented with at least any of the structure noted herein for the controller and can be pure hardware or a combination of hardware and computer-readable program code.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front-end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back-end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back-end module 110.

The data storage device 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
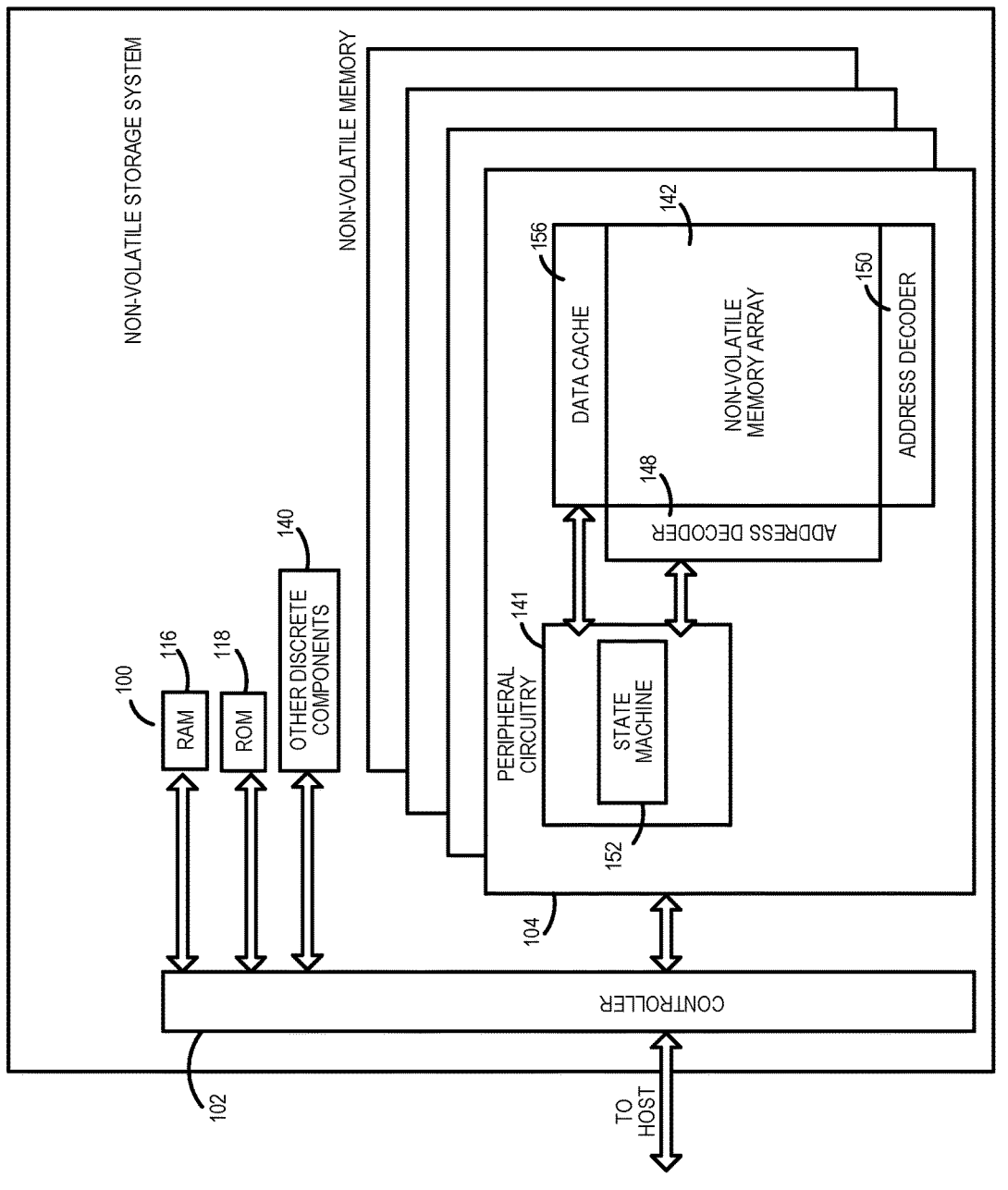
FIG. 2B is a block diagram illustrating components of the memory data storage device illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two-dimensional and/or three-dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may be written in only multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
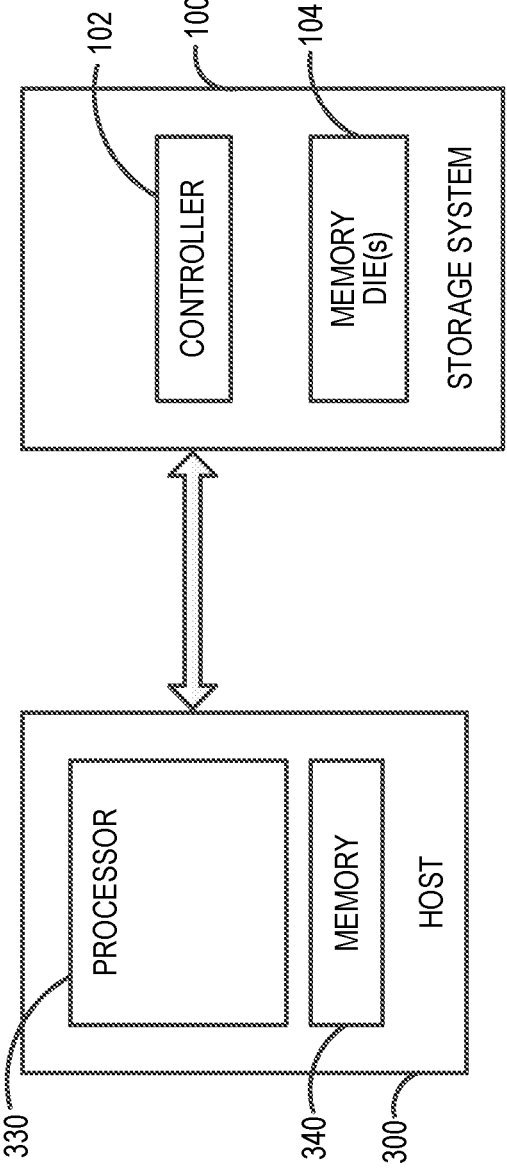
FIG. 3 is a block diagram of a host and data storage device of an embodiment.

Turning again to the drawings, FIG. 3 is a block diagram of a host 300 and data storage device 100 of an embodiment. The host 300 can take any suitable form, including, but not limited to, a computer, a mobile phone, a tablet, a wearable device, a digital video recorder, a surveillance system, etc. The host 300 in this embodiment (here, a computing device) comprises a processor 330 and a memory 340. In one embodiment, computer-readable program code stored in the host memory 340 configures the host processor 330 to perform the acts described herein. So, actions performed by the host 300 are sometimes referred to herein as being performed by an application (computer-readable program code) run on the host 300. For example, the host 300 can be configured to send data (e.g., initially stored in the host's memory 340) to the data storage device 100 for storage in the data storage device's memory 104.

As discussed above, a host can store and read data from a memory in a data storage device. Some applications, such as automotive applications, may require the data storage device operate at a certain level of reliability. However, the reliability of a data storage device can decrease due to various errors that can occur in the stored data. Such errors can also increase the latency in reading the data, as time is spent by the data storage device during the read operation to attempt to correct the errors in the data. To increase reliability and reduce latency, the data storage device can automatically perform internal background operations to attempt to correct errors in the stored data before a host requests the data be read.

Also, the Universal Flash Storage (UFS) 3.1 specification defines a "host manual refresh (HMR)" command. In response to receiving the HMR command from the host, the data storage device can perform a background refresh operation on the entirety of its memory or on certain memory blocks selected by the data storage device. However, such a refresh operation can take a relatively-long time and is not customizable by the host. So, the host is not able to request a refresh of only a portion of the memory. As such, the host needs to wait for the entire memory (or the blocks chosen by the data storage device) to be refreshed even through the host only needs a smaller portion refreshed. Further, the refreshing is done by the data storage device during its idle time, which can delay the refresh to a time later than the host desires. Also, in HMR, blocks (or memory areas) that already refreshed are not exposed to the host as being refreshed.

The following embodiments can be used to address these issues. More specifically, with these embodiments, the host 300 can command the data storage device 100 to perform a refresh of a specific area of the memory 104 (e.g., a logical unit number (partition) and/or logical block address (address range) as a foreground operation (i.e., configuring the "mode of work"). That way, the refresh operation is performed, on host demand, in only the location in the memory 104 desired by the host 300. As such, these embodiments can significantly reduce the time needed to refresh host-selected areas of the memory 104, resulting in a more-efficient and less power-consuming refresh process than the one discussed above, as the data storage device 100 will not waste time refreshing areas of the memory 104 that the host 300 does not need refreshed. Further, by providing the host 300 with the option to refresh a specific area in the memory 104 in a relatively-short amount of time, the host 300 will experience relatively-low latency in reading data that was refreshed.

Additionally, with these embodiments, the host 300 can have full visibility on the "reliability status (level)" for an identified location in the memory 104 and can build statistics based on that information. Reliability status (level) can be calculated in any suitable way. For example, reliability status (level) can be calculated based on a bit error rate (BER), a failed bit count (FBC), and/or a last write time (e.g., as indicated by a real-time clock (RTC) of a given memory location or area).

Figure 4:
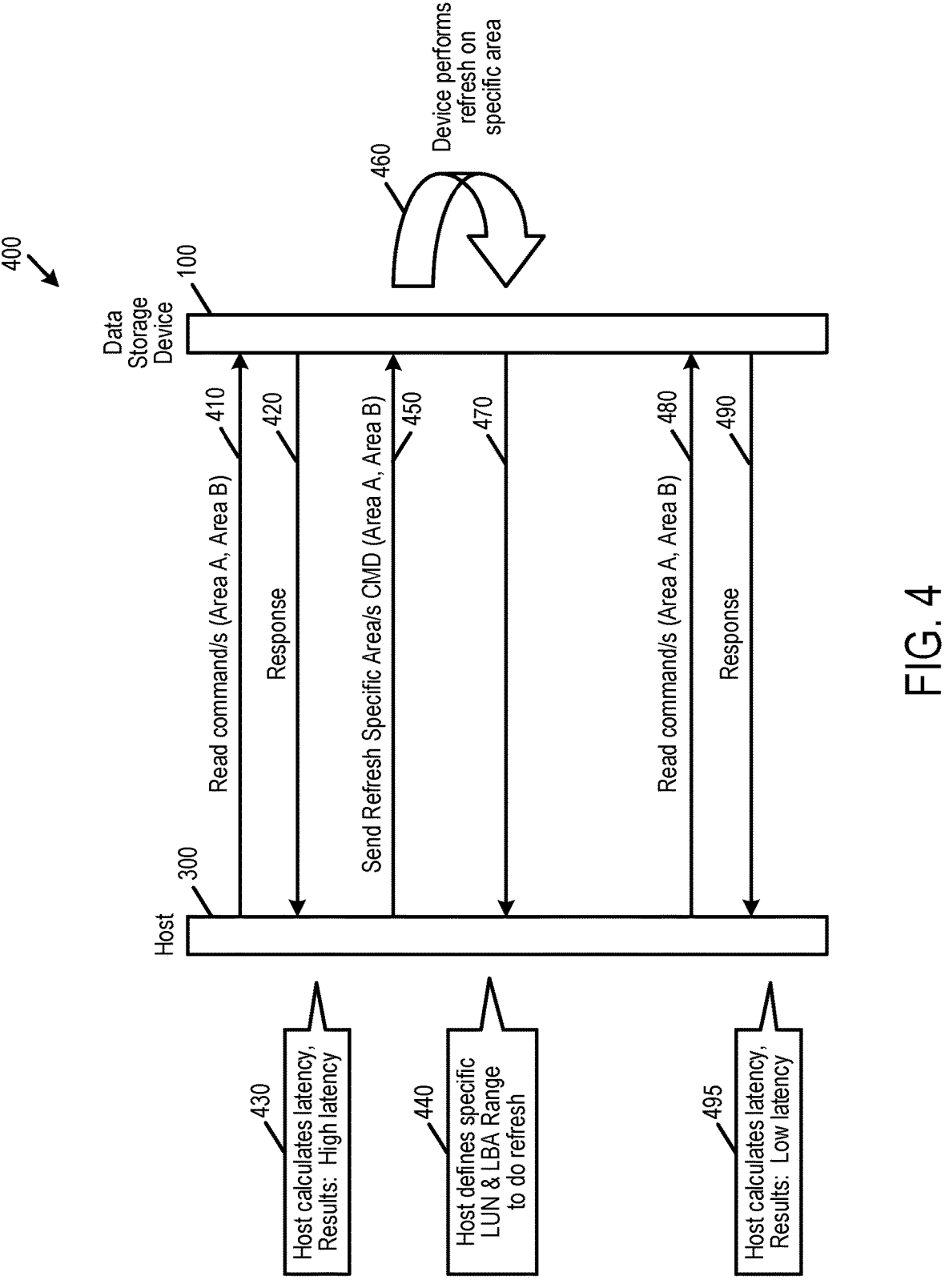
FIG. 4 is a flow diagram of a refresh operation of an embodiment.

Turning again to the drawings, FIG. 4 is a flow diagram 400 illustrating a refresh operation of an embodiment. As shown in FIG. 4, the host 300 sends read commands to the data storage device 100 to read data from certain locations in the memory 104 (act 410). The locations can be identified in any suitable way, such as, but not limited to, by a logical unit number (e.g., a partition identifier) and/or or a logical block address (LBA) (or LBA range). In the example shown in FIG. 4, the host 300 sends read commands to the data storage device 100 to read Area A, which is a boot area, and Area B. In response, the controller 102 of the data storage device 100 reads the data stored in those areas, performs error correction, as needed, and returns the read data to the host 300 (act 420).

The host 300 then calculates the latency in reading the requested data and compares the calculated latency to a threshold (act 435). Here, the calculated latency exceeds the threshold and is considered "high." As high latency is not desired by the host 300 in this example, the host 300 sends a command to the data storage device 100 to perform a targeted refresh operation on only certain areas of the memory 104 defined by the host 300 (acts 440 and 450) (in this example, LUN 0x3, LBA range 0-100 and LUN 0x3, LBA range 100-300). It should be noted that while the request includes both Areas A and B in this example, it is possible for the host 300 to select only one (or none) of the areas. For example, if only Area A's latency is high, the host 300 can request a targeted refresh only for Area A.

In response to receiving the targeted refresh command from the host 300, the controller 102 of the data storage device 100 performs the targeted refresh (act 460). In one embodiment, the refresh is performed by the controller 102 as a foreground operation soon after the targeted refresh command is received from the host 300, as opposed to performing the targeted refresh as a background operation.

The targeted refresh can be performed in any suitable way. For example, the controller 102 of the data storage device 100 can read the data in the memory locations identified by the host 300, attempt to correct any errors found in the data (e.g., those with a FBC above a threshold), and write the corrected data back to the memory 104 (e.g., in a different physical address in the memory). After the target refresh operation is completed, the controller 102 of the data storage device 100 can send an acknowledgment signal back to the host 300 (act 470). The acknowledgment can include the reliability status (level) for visibility if the host 300 requests it. Later, the host 300 sends commands to read Areas A and B (act 480), receives the data back form the host (act 490), and re-calculates the latency (act 495). If the latency is still higher than desired, the host 300 can resend the request for the targeted refresh of those areas.

In the above example, the host 300 calculated the latency of an area in the memory 104 to determine whether to send a target refresh command to the data storage device 100. In another embodiment, the controller 102 in the data storage device 100 can make that determination. This embodiment will now be discussed in conjunction with the flow diagram 500 of FIG. 5.

Figure 5:
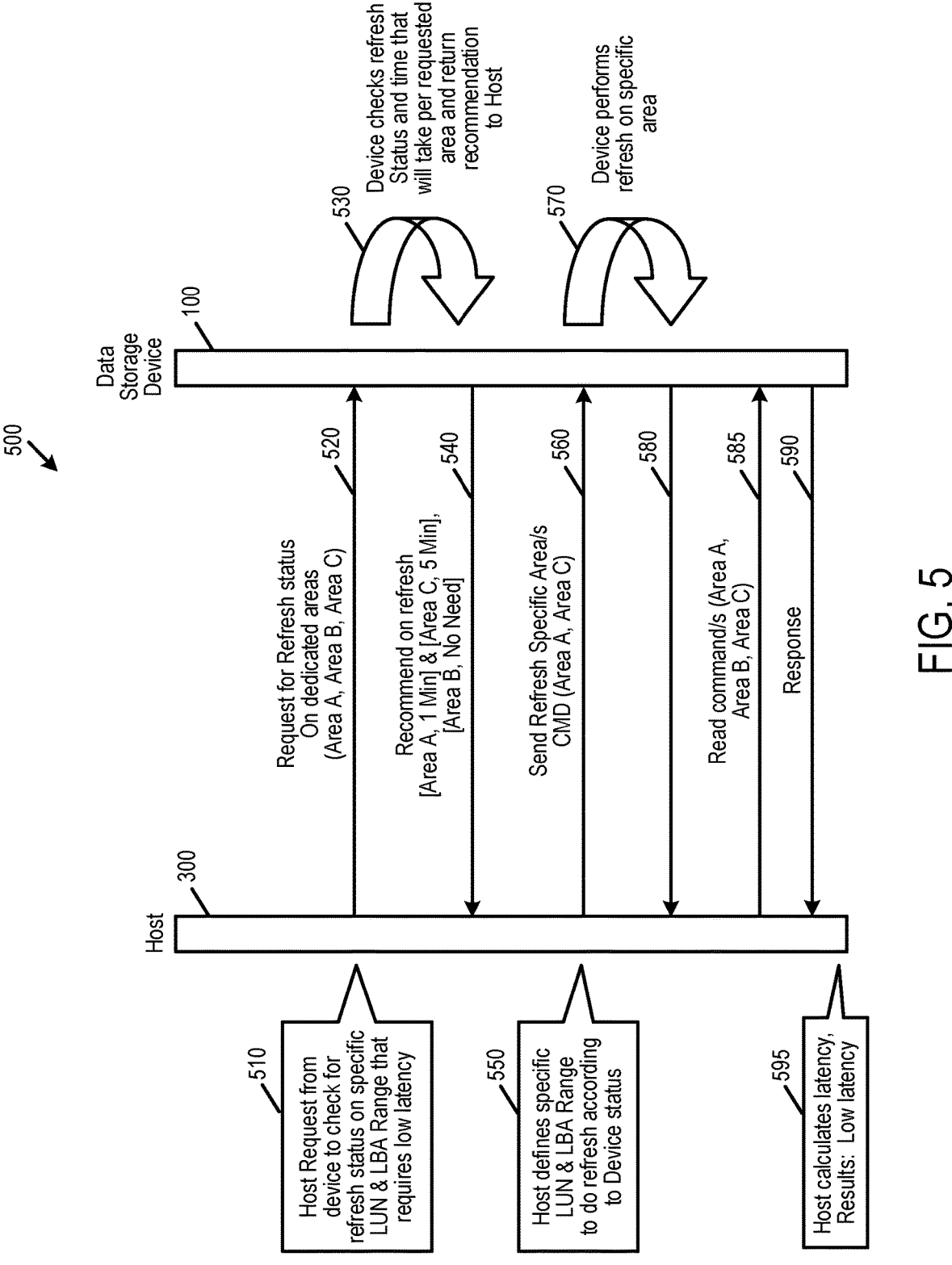
FIG. 5 is a flow diagram of a refresh operation of an embodiment.

As shown in FIG. 5, in this embodiment, the host 300 sends a request to the data storage device 100 for a refresh status of certain areas of the memory 104 that require low latency (acts 510, 520). In this example, the areas are Area A (LUN 0x8, LBA range 0-100), which is the boot area, Area B (LUN 0x3, LBA range 100-300), and Area C (LUN 0x2, LBA range 700-800). In response the request, the controller 102 in the data storage device 100 checks the refresh status and calculates the time that it will take to perform a refresh operation on the requested areas (act 530). The controller 102 in the data storage device 100 then returns a recommendation to the host 300 on which areas to refresh (act 540). In this example, the data storage device 100 is recommending a refresh of Areas A and C but not Area B.

This gives the host 300 visibility into the reliability status of the areas, as well as an indication of the time needed to perform the refresh of those areas. With that information, the host 300 can define specific location(s) in the memory 104 for a targeted refresh operation and send the targeted refresh operation request to the data storage device 100 (acts 550, 560). (Alternatively, the controller 102 in the data storage device 100 can perform the targeted refresh operations without further input from the host 300.) The controller 102 in the data storage device 100 then performs the refresh operation on the identified area(s) (act 570) and sends an acknowledgement to the host 300 (act 580). Later, the host 300 sends reads commands to the data storage device 100 to read the areas (act 5485, gets the data back from the data storage device 100 (act 590), and calculates the latency (act 595). If the latency is not in the desired range in one or more of the areas, the host 300 can send a targeted refresh request to the host 300 to refresh those area(s).

There are many alternatives that can be used with these embodiments. For example, the host 300 can provide a condition to the host 300, such that the targeted refresh operation is performed only if the condition is satisfied. For example, the host 300 can specify a certain program-erase count (PEC) for an identified area of the memory 104, and the controller 102 in the data storage device 100 can perform a refresh operation on that area if memory 104 only if the PEC of that area is above the threshold.

As another alternative, these embodiments can be used in combination with a patrol read (read audit/data scrub) operation. For example, the controller 102 in the data storage device 100 can bump the priority of any page that belongs to the refresh region identified by the host 300 in the list of pages for relocation. As another example, the controller 102 in the data storage device 100 can limit the address range of the read patrol operation to the one asked by the host 300 until that range is fully covered, after which the read patrol range is open to the entire memory 103. As yet another example, when a page in a block is identified for a targeted refresh, the controller 102 in the data storage device 100 can increase the probability to draw pages from the same block as it might be required to move more pages from same block.

Further, instead of relocating a low-reliability (e.g., high FBC) area of the memory 104 in a read patrol operation, the controller 102 in the data storage device 100 can update the read threshold (or guardian tables). If, after the update, FBC is still high, the controller 102 can relocate the data. In most cases, adjusting the read thresholds in the address region should avoid the need for relocation. This alternative recognizes that, in many cases, the high fail bit count (FBC) is not caused by low reliability and voltage distribution overlap, but by misaligned or not-updated read thresholds. Preempting the update of read thresholds may eliminate the relocation step and can be considered as a refresh if the outcome is reducing FBC to a point in which the delay is back to normal.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/ or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three-dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A data storage device comprising:
a memory; and
a controller configured to communicate with the memory and further configured to:
    receive, from a host, an identification of a location in the memory;
    calculate an estimated time to refresh the location in the memory;
    send the estimated time to the host;
    refresh the location in the memory; and
    prioritize the location in the memory for a read patrol operation.

2. The data storage device of claim 1, wherein the controller is further configured to:
    receive, from the host, a request to refresh the location in the memory;
    wherein the location in the memory is refreshed in response to the request from the host to refresh the location in the memory.

3. The data storage device of claim 1, wherein the controller is further configured to:
    determine a reliability level of the location in the memory;
    wherein the estimated time to refresh the location in the memory is calculated in response to the reliability level being below a threshold.

4. The data storage device of claim 1, wherein the controller is further configured to:
    receive, from the host, a condition;
    wherein the estimated time to refresh the location in the memory is calculated in response to the condition being satisfied.

5. The data storage device of claim 4, wherein the condition comprises a program-erase count threshold of the location in the memory.

6. The data storage device of claim 1, wherein the location in the memory is identified by a logical block address.

7. The data storage device of claim 1, wherein the location in the memory is identified by a logical unit number.

8. The data storage device of claim 1, wherein the controller is further configured to:
    increase a number of pages in the location in the memory available for the read patrol operation.

9. The data storage device of claim 1, wherein the controller is further configured to:
    update a read threshold for the location in the memory during the read patrol operation on the location in the memory.

10. The data storage device of claim 1, wherein the location in the memory is a subset of the memory.

11. The data storage device of claim 1, wherein the memory comprises a three-dimensional memory array.

12. A method comprising:
performing in a host in communication with a data storage device comprising a memory:
    sending, to the data storage device, an identification of a plurality of areas in the memory and a request for a recommendation on which area(s) of the plurality of areas in the memory to refresh;
    receiving, from the data storage device, a recommendation on which area(s) of the plurality of areas in the memory to refresh, wherein the recommendation is based on the data storage device's calculation of an estimated time to refresh each of the plurality of areas in the memory;
    sending, to the data storage device, a command to refresh selected area(s) of the plurality of locations in the memory.

13. The method of claim 12, further comprising:
calculating a latency in reading an area in the memory after the area in the memory has been refreshed.

14. The method of claim 12, further comprising:
sending a condition to the data storage device;
wherein the data storage device is configured to refresh an area in the memory in response to the condition being satisfied.

15. The method of claim 14, wherein the condition comprises a program-erase count threshold of the area in the memory.

16. The method of claim 12, wherein an area in the memory is identified by a logical block address.

17. The method of claim 12, wherein an area in the memory is identified by a logical unit number.

18. A data storage device comprising:
a memory; and
means for;
    receiving, from a host an identification of a location in the memory;
    calculating an estimated time to refresh the location in the memory;
    sending the estimated time to the host;
    refreshing the location in the memory; and increasing a number of pages in the location in the memory available for a read patrol operation and/or updating a read threshold for the location in the memory during the read patrol operation on the location in the memory.

\*  \*  \*  \*  \*